United States Patent
Schultz et al.

(10) Patent No.: US 8,409,716 B2
(45) Date of Patent: Apr. 2, 2013

(54) GLASS OR GLASS-CERAMIC SUBSTRATE WITH SCRATCH-RESISTANT COATING AND METHOD FOR THE PRODUCTION THEREOF

(75) Inventors: Niko Schultz, Essenheim (DE); Christian Henn, Frei-Laubersheim (DE); Falk Gabel, Schlangenbad (DE); Andreas Hahn, Hochstetten-Dhaun (DE)

(73) Assignee: Schott AG, Mainz (DE)

( * ) Notice: Subject to any disclaimer, the term of this patent is extended or adjusted under 35 U.S.C. 154(b) by 134 days.

(21) Appl. No.: 12/590,048

(22) Filed: Oct. 30, 2009

(65) Prior Publication Data
US 2010/0215950 A1 Aug. 26, 2010

(30) Foreign Application Priority Data
Oct. 31, 2008 (DE) .................. 10 2008 054 139

(51) Int. Cl.
*B32B 17/06* (2006.01)

(52) U.S. Cl. ......... 428/428; 428/336; 428/698; 428/702

(58) Field of Classification Search .......... 428/336, 428/408, 426, 446, 698, 701, 702, 704, 428
See application file for complete search history.

(56) References Cited

U.S. PATENT DOCUMENTS

| | | | | |
|---|---|---|---|---|
| 5,508,092 A * | 4/1996 | Kimock et al. | ............... | 428/216 |
| 6,495,251 B1 * | 12/2002 | Arbab et al. | .................. | 428/336 |
| 6,942,920 B2 * | 9/2005 | Carre et al. | ................... | 428/408 |
| 2001/0016262 A1 * | 8/2001 | Toyoshima et al. | ........... | 428/428 |
| 2005/0037240 A1 * | 2/2005 | Haoto et al. | .................. | 428/698 |
| 2006/0121290 A1 * | 6/2006 | Chonlamaitri et al. | ....... | 428/428 |
| 2006/0240266 A1 * | 10/2006 | Schicht et al. | ................ | 428/426 |
| 2007/0270299 A1 * | 11/2007 | Rosenflanz et al. | ............ | 501/10 |
| 2008/0190409 A1 * | 8/2008 | Demol et al. | ................. | 126/211 |

FOREIGN PATENT DOCUMENTS

| | | |
|---|---|---|
| DE | 19851280 | 5/2000 |
| DE | 10100221 | 7/2001 |
| EP | 0501632 | 8/1995 |
| EP | 0723944 | 7/1996 |
| EP | 1005440 | 9/2004 |
| GB | 2293179 | 3/1996 |
| WO | WO 03/050055 | 6/2003 |
| WO | WO2006/118851 | 11/2006 |
| WO | WO2006/133786 | 12/2006 |
| WO | WO2007/000532 | 1/2007 |

OTHER PUBLICATIONS

Free Dictionary. com.*
Römpp Lexicon, "Chemistry," vol. 4, 1998, 3pp.
Mertz, K. W. et al, "Advanced Surface Coatings;" Hanser, 2001, 14pp.
Opposition dated Jan. 6, 2011 filed against German Patent Application No. 10 2008 054 139.
Letter of the Opponent dated Apr. 21, 2012 corresponding to German Patent Application No. 10 2008 054 139.

* cited by examiner

*Primary Examiner* — Jennifer McNeil
*Assistant Examiner* — Lauren Colgan
(74) *Attorney, Agent, or Firm* — Ohlandt, Greeley, Ruggiero & Perle, LLP.

(57) ABSTRACT

The invention in general relates to glass or glass-ceramic products. In order to protect the surface of such products against scratching, a silicon oxynitride coating with special composition is provided.

19 Claims, 4 Drawing Sheets

Legend:
- □ Vickers-Hardness
- △ Measured transmission of deposited silicon oxynitride layers
- ◇ Simulated transmission of homogeneous silicon oxynitride layers
- ○ Haze value after scrubbing test (measured values multipled by a factor of 500)

GLASS OR GLASS-CERAMIC SUBSTRATE WITH SCRATCH-RESISTANT COATING AND METHOD FOR THE PRODUCTION THEREOF

CROSS REFERENCE TO RELATED APPLICATIONS

This application claims benefit under 35 U.S.C. §119(a) of German Patent Application No. 10 2008 054 139.7-45, filed Oct. 31, 2008.

BACKGROUND OF THE INVENTION

1. Field of the Invention

The invention in general relates to glass or glass ceramics. In particular, the invention relates to glass or glass-ceramics plates with a scratch-resistant layer.

2. Description of Related Art

Hard-material layers are used in many ways as coatings for components and tools in order to prolong the service life. Coatings on metals are used in such cases. Layers such as TiN or WC:C are deposited by means of an arc-supported method with process times of several hours. These methods are used with metal substrates in batch plants. The layers produced in these processes are frequently subjected to strong voltages, so that they often often crack in the plants. Crack-free, and particularly transparent, scratch-resistant layers on glass are especially difficult to produce with this technology.

Silicon nitride layers are in fact color-neutral and very transparent, but show transmission losses of approximately 7-10% absolute due to reflection losses, when compared with uncoated glasses having a transmission in the visible spectral region of approximately 92%. However, since highly transparent glasses are particularly required in the motor vehicle industry, any increase in transmission here increases the field of application of scratch-resistant coated plates.

BREIF SUMMARY OF THE INVENTION

The object of the invention is thus to provide, for a glass surface, a transparent mechanical scratch-resistant coating, which combines a good transmission with a good scratch-resistant effect. With respect to the scratch-resistant effect, the coating will thus assure protection against mechanical abrasion or impact. One example is protection of vehicle glazing during sandstorms. Another example is protecting barcode windows from being scratched due to the moving of products over them. In such applications, a high transparency and a small light scattering, even after long use, are desired, in addition to an increased scratch-resistant effect.

The object of the invention is achieved by the disclosed glass or glass-ceramic substrate and methods for the production thereof.

A thick silicon oxynitride coating is proposed as a solution to the problem.

A glass article with a scratch-resistant coating, which comprises a glass substrate or a glass-ceramic substrate, as well as a silicon oxynitride layer coated thereon as a scratch-resistant layer is especially provided. The coating is characterized by the fact that the ratio of atomic percentages of oxygen to nitrogen in the silicon oxynitride layer amounts to more than 1, preferably at least 2, as measured with secondary-ion mass spectrometry and etching of the layer by means of a cesium ion beam. Therefore, oxygen-rich silicon oxynitride layers are used according to the invention. In the sense of the invention, this ratio applies to the average oxygen content or is the average ratio of atomic percentages of oxygen and nitrogen. The ratio may vary throughout, even within the silicon oxynitride layer.

The oxygen component in the layer causes a reduction in the refractive index when contrasted with a pure silicon nitride layer and in this way reduces reflections at the air/layer and layer/glass interfaces—whereupon transmission increases when compared with a pure silicon nitride layer. Of course, this is also accompanied by a reduced hardness, since the silicon oxynitride layer approximates a silicon oxide layer with increasing oxygen content, which is no longer greatly distinguished from typical glass substrates or glass-ceramic substrates with respect to its hardness.

It has been surprisingly established, however, that the scratch-resistant effect remains up to very high oxygen contents of the layer. The ratio of atomic percentages of oxygen to nitrogen in the silicon oxynitride layer, which is measured with secondary-ion mass spectrometry and etching of the layer by means of a cesium ion beam, should amount to 20 at most, however, since beyond this region, the scratch-resistant effect notably decreases.

The fact that the layers provided according to the invention have a high scratch-resistant effect in comparison to other hard material layers, even though the oxygen content is relatively high, may be attributed to the type of load on the layer. In order to act as a scratch-resistant layer, a high resistance to loads such as those occurring in scrubbing tests is required, rather than simply a high absolute Vickers hardness. As a comparative example, let us name here titanium nitride layers, which typically have a Vickers hardness of 2000 and offer instead a resistance to wear. The coatings according to the invention in contrast have proven suitable even if they are in general surprisingly soft with respect to the Vickers hardness.

Thus, silicon oxynitride layers according to the invention typically have a Vickers hardness of less than 1400, preferably less than 1200. Therefore, instead of being defined by the oxygen content of the silicon nitride layer, the invention can be defined alternatively also by its small Vickers hardness as mentioned above, whereby the Vickers hardness is influenced not by the composition alone, but also by the morphology and density of the layer, as well as by the substrate lying thereunder.

In addition, a relatively low refractive index, which provides for a smaller difference in the refractive index at the interfaces of the layer, accompanies the high oxygen content. The refractive index of the silicon oxynitride layer typically lies at most at 1.9. Instead of being defined by the oxygen content of the layer, the invention thus can also be defined by its low refractive index. Also, in the case of the refractive index, the morphology and density of the layer play a role, in addition to the composition. As a lower limit of the refractive index for the silicon oxynitride layer, on the other hand, one strives for a value of at least 1.6, since lower refractive values are accompanied by very high oxygen contents and thus have layers similar to silicon oxide, which in turn have decreased scratch-resistance properties.

Since the refractive index of the scratch-resistant coating according to the invention is relatively low, this also permits the use of substrates with low refractive index without considerable reflection losses at the interface to the scratch-resistant coating. According to an enhancement of the invention, the refractive index of the glass or glass-ceramic substrate is less than 1.6.

The invention is particularly suitable for clear, transparent substrates, such as, e.g., viewing windows. Thus, it is designed particularly for use in vehicle windshields or windows for bar codes.

The invention can be used to advantage, however, also on substrates that are not clearly transparent or are volume-colored, such as, for example, several types of glass ceramics. Among other things, it is intended for glass-ceramic cooktops. The coating of glass-ceramic cooktops for scratch protection is therefore of advantage, since the coating is particularly unobtrusive optically due to its better match to the refractive index of the substrate. Thus, the esthetic appearance of the cooktop or the provided design must be disrupted as little as possible or not at all. Also, the colors of a decoration on the glass ceramics will be altered as little as possible.

Since the coating is very unobtrusive optically and transmission is barely influenced, the layer can be kept comparatively thick with good transmission. The layer thickness of the silicon oxynitride layer thus preferably amounts to at least 500 nanometers. A suitable range for layer thicknesses particularly lies between 0.5 and 2.5 μm, preferably up to 2 μm, in order to obtain a considerable mechanical improvement when compared with an uncoated glass surface and additionally to obtain good transmission properties and/or an optically unobtrusive coating.

Using a coating according to the invention, an average transmission of at least 86% can still be attained in a wavelength region between 400 nanometers and 650 nanometers on a glass plate used as a substrate with a typical transmission of approximately 92%. In contrast to this, the transmission of other hard material layers and oxygen-poor silicon oxynitride layers is lower. Thus, the transmission of a pure silicon nitride layer on such a substrate is only approximately 82% due to the higher refractive index and the higher reflection at the interfaces that are associated therewith.

The high oxygen content of the layers offers a further advantage. A very good bonding of the layer onto the substrate is produced, in particular for oxidic glasses and glass ceramics. The silicon oxynitride coating is therefore particularly preferably deposited directly onto the surface of the glass or glass-ceramic substrate. The deposition of intermediate layers for improving the bonding can accordingly be dispensed with.

The silicon oxynitride layer is deposited by sputtering according to the invention. The method for producing a glass article with a scratch-resistant coating according to the invention comprises the following steps therefor:

Introducing a glass or glass-ceramic substrate into a vacuum chamber and

Sputtering a silicon oxynitride layer employing a plasma in a process gas that contains oxygen and nitrogen and a silicon target, the composition of the process gas being adjusted by regulating the flow of oxygen, and an average oxygen content of the process gas being adjusted to at least 20%. The substrate preferably moves past the target in a pendulum motion in order to achieve more homogeneous layer thicknesses.

In addition to oxygen and nitrogen, argon or another inert gas is another typical process gas component. For regulating the oxygen content, the flow of nitrogen, as well as the flow of other process-gas components that are optionally present preferably will be kept constant in order to simplify the control of the process.

The oxygen content is thus determined as a volume proportion of the oxygen molecules that are introduced. A preferred type of plant here is an in-line sputtering plant with a vertical magnetron. Mid-frequency is preferably used for generating the plasma (so-called MF sputtering). The frequencies of the alternating field with MF sputtering typically lie between 10 kHz and 100 kHz.

Since higher oxygen contents produce better layers with respect to transmission, an average oxygen content of the process gas of at least 30% is preferred.

Regulation via the oxygen content is offered not only because higher oxygen contents in the layer are preferred, but also because it has been shown surprisingly that the regulation of the oxygen flow, compared with regulation of another process-gas component, such as, preferably, nitrogen, also leads to more homogeneous layers overall with respect to their composition.

In order to improve the homogeneity of the layers in the case of greater layer thicknesses, it is additionally preferred that the substrate is moved past the target at least four times, preferably at least six times, particularly preferred at least ten times.

Application possibilities for the above-described invention may involve mechanically loaded glass surfaces, in which a permanently high transmission is important. Examples are motor-vehicle glazings, particularly for application in sandy regions. Here, windshields can become nontransparent due to abrasion, which occurs even when the vehicle is not moving due to sand entrained by the wind, as well as by use of windshield wipers in the case of front windshields coated with sand. Other applications are, for example, protection of glazings for checkout scanners. Here, bar codes of products are scanned in while they are moved over a glass plate. Transparent, scratch-resistant layers in these applications lead to increases in lifetime and cost savings due to longer service life.

Borosilicate glasses are particularly preferred for viewing plates and windows as substrates, preferably borosilicate float glass plates, due to their good optical and mechanical properties. Soda-lime glasses can also be considerably improved relative to their durability by the coating according to the invention.

The morphology of the layers probably also contributes to the good scratch-resistant properties despite the high oxygen content. It has proven very favorable to deposit the silicon oxynitride layer with a very high power. In special cases, it has proven favorable to use a power greater than 10 Watts per $cm^2$, preferably at least 12 Watts per $cm^2$ of target surface for the sputtering. In the case of silicon nitride layers, it has been shown here that the layers are x-ray amorphous. This means that sharp interferences that are clearly pronounced, in particular, by more than 10% of the average background signal, do not occur in x-ray diffraction spectra. Instead, in all cases, diffuse interference is present with small angles of diffraction. Overall, it can be concluded that, at most, nanocrystalline phases or segregations, which have a phase content of less than 10 vol. %, exist in the coating. Recognizable structures are also not seen in electron micrographs.

The oxygen-rich silicon oxynitride layers according to the invention are equal in their appearance in the electron microscope to silicon nitride layers that are detected as x-ray amorphous. Therefore, it can be derived from this that silicon oxynitride layers, which have been deposited at the indicated high powers, also have a morphology without structure, or they are x-ray amorphous.

The silicon oxynitride coating according to the invention can also be combined with other layers. Accordingly, in an enhancement of the invention, a multi-layer scratch-resistant coating is provided with at least one silicon oxynitride layer. This additional layer can improve the scratch-resistant effect and/or the optical properties.

The transmission properties can thus also be improved by an alternating layer system according to a type of interference layer system. In particular, it is offered here to create the multi-layer scratch-resistant coating as an alternating layer system, which comprises at least one silicon oxynitride layer and at least one silicon nitride layer. This is favorable, since one can omit changing the target and only the process gas composition needs to be changed by simply stopping the oxygen introduction and optionally adjusting the flow of other process-gas components during the deposition of the silicon nitride layer.

In addition, it has overall been demonstrated favorable for the transmission properties, if the silicon oxynitride layer is deposited with several first layer parts and second layer parts following one another, the first layer parts having a higher oxygen content than the second layer parts. Accordingly, the silicon oxynitride layer itself attains the structure of an alternating layer system, which increases transmission.

The coating may also have a variation of the oxygen and nitrogen content, which corresponds rather to a gradient of multiple deposited layer parts.

A variation of the oxygen content in the layer in the form of several sequential deposited layer parts with alternating different oxygen content can be brought about surprisingly even by the pendulum movement of the substrate during the coating. Thus, a change in the process-gas composition is attained by varying positions, since the relative positions of the gas inlets, the target and the substrate change periodically due to the back-and-forth movement of the substrate. According to an enhancement of the method according to the invention, therefore, a silicon oxynitride layer is deposited with several sequential or alternating first layer parts and second layer parts, the first layer parts having a higher oxygen content than the second layer parts, whereby the variation of the oxygen content is achieved due to the back-and-forth movement of the substrate at the target.

Favorable layer properties could then be obtained, in particular, for the above-described embodiment, if the first layer parts have an oxygen content which is higher by a factor between 1.1 and 2 than in the second layer parts.

It is surprisingly favorable if the variation in refractive index between the deposited layer parts is not too high. Thus, it has been demonstrated favorable for the layer properties, if the refractive index of the first and second layer parts differs by 0.2 at most. In the case of a multi-part gradient layer system, the average refractive index of the layer parts is therefore used. For the construction of an effective interference layer system, one would normally strive for large differences in the refractive index. In the case of the silicon oxynitride layer, however, it has been shown that large differences in refractive values or the accompanying large variations in the oxygen and nitrogen contents can over-proportionally reduce the scratch resistance without producing a considerable improvement in transmission.

The invention will be explained in detail below based on embodiment examples with reference to the appended figures. Here, the same reference numbers in the figures refer to the same or corresponding elements.

DETAILED DESCRIPTION OF THE INVENTION

Figure 1:
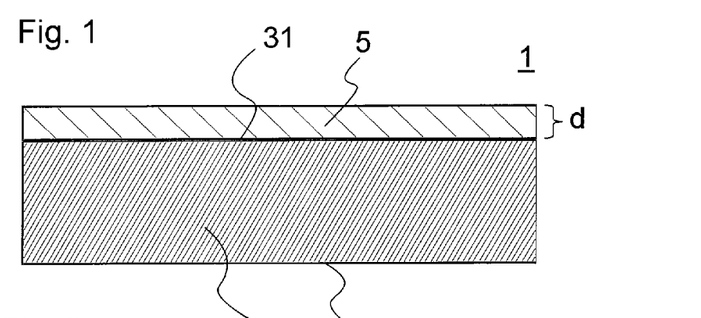
FIG. 1 shows a cross section through a glass article according to the invention.

FIG. 1 shows a glass article 1 according to the invention. Glass article 1 comprises a glass or glass-ceramic substrate 3, preferably in the shape of a plate, with sides 31, 32. A scratch-resistant coating of thickness d is deposited on side 31. Depending on the application in each case, a corresponding layer 5 can also be deposited on the opposite-lying side 32.

The scratch-resistant coating 5 in the example shown in FIG. 1 is a silicon oxynitride layer 5, in which the ratio of atomic percentages of oxygen to nitrogen amounts to more than 1, but preferably at least 2, as measured with secondary-ion mass spectrometry and etching of the layer by means of a cesium ion beam. On the other hand, the ratio of atomic percentages of oxygen to nitrogen in the silicon oxynitride layer, measured with secondary-ion mass spectrometry and etching of the layer by means of a cesium ion beam should not exceed a factor of 20. Even layers with a ratio of 16 to 1, however, for example, still showed good scratch resistance properties in tests, combined with high transmission.

An MF sputtering device is used for the desposition, whereby the silicon oxynitride layer is sputtered by employing a plasma in a process gas containing oxygen and nitrogen and a silicon target, and the composition of the process gas is adjusted or re-adjusted by regulating the flow of oxygen. The deposition is produced with a mean oxygen content of at least 20 volume percent in the process gas. In order to obtain uniform coatings, the substrate is moved past the target in a pendulum motion. In this way, without limitation to the example of embodiment shown in FIG. 1, layers with a homogeneity of better than 95% in the layer thickness d are obtained.

Substrate 3 is preferably an oxidic glass or an oxidic glass ceramic. Also, since the silicon oxynitride layer 5 contains oxygen, it shows a good bonding to substrate 3, so that an intermediate layer as a bonding agent can be omitted, and silicon oxynitride layer 5 is deposited directly onto side 31 of the substrate surface.

The thickness d of silicon oxynitride layer 5 preferably lies in the range of 0.5 µm to 2.5 µm, preferably between 1 and 2 µm.

Due to the high oxygen content of layer 5, its refractive index is also comparatively low. The refractive index of layer 5 lies between 1.9 and 1.6. The refractive index of the substrate preferably is less than 1.6, so that the difference in the refractive index at the interface to substrate 3 is reduced in comparison to other scratch-resistant layers, due to the low refractive index of silicon oxynitride layer 5, without anything further. In this way, a good value can be obtained for the transmission, even without the use of expensive high-refracting glasses. Clear, transparent glasses, preferably borosilicate glasses, and, in particular, borosilicate float glass plates, are preferred for glasses as substrates.

For the production of glass article 1, substrate 3 in the form of a glass or glass-ceramic plate is positioned on a carrier in a vertical in-line magnetron sputtering plant and is sputtered at a feed rate of 0.33 m/min, for example. Typically 6 pendulum passes are required due to this feed rate in order to introduce a 1-μm thick silicon oxynitride layer. Due to a high sputtering power of more than 15 W/cm$^2$, very dense, amorphous layers are obtained, which possess optimal tribological properties with high transmission. The composition of nitrogen and oxygen is reacted via regulating the reactive gas. For the production of mechanically stable layers according to the invention, regulation is conducted via the oxygen component, while the nitrogen is to be added as a fixed adjusted flow.

Figure 2:
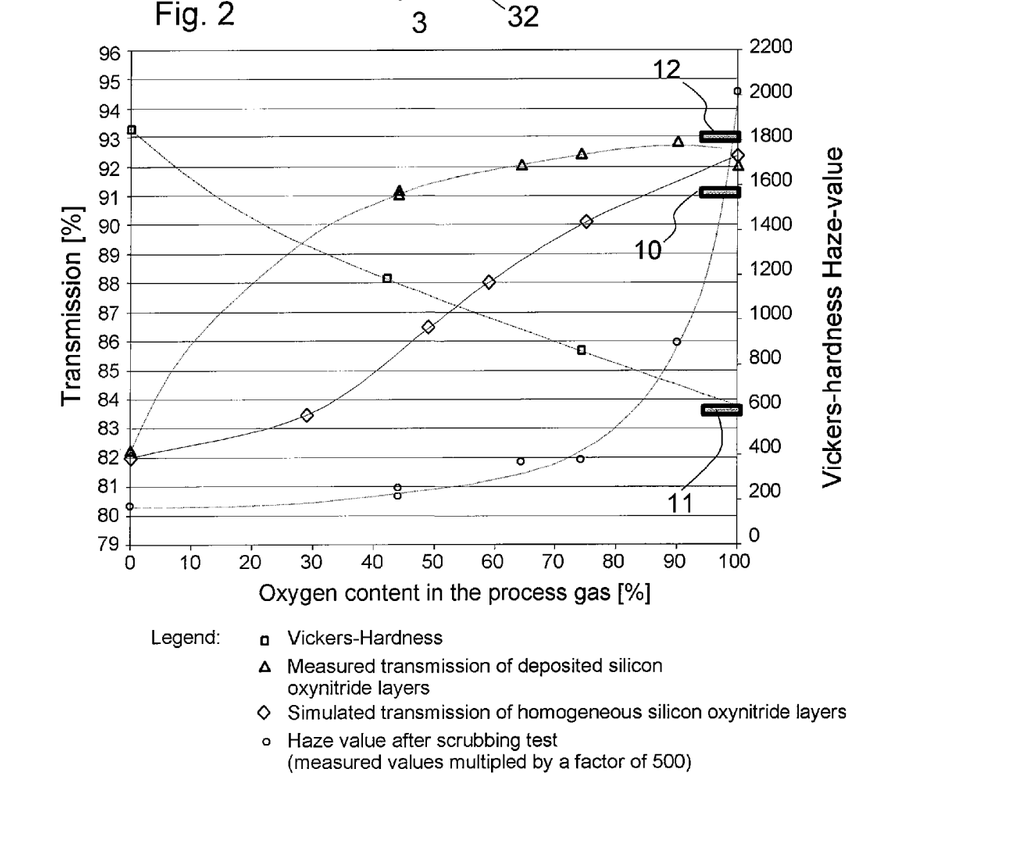
FIG. 2 shows a diagram of measured values of different properties of a glass article with a silicon oxynitride layer deposited thereon as a function of the oxygen content in the process gas during the deposition of the layer.

FIG. 2 shows measured values for the transmission and for the Vickers hardness and for the haze value according to a scrubbing test load, as measured on different coated flat glass substrates of borosilicate glass, whereby the coatings were deposited with different oxygen contents in the process gas. A mixture of nitrogen and oxygen was used as the process gas. Each of the coatings has a thickness of approximately 1.6 micrometers.

The measured values for haze were determined with a measurement device for determining the optical appearance of glass, films, plastics, as well as other transparent materials. Here, the sample is illuminated perpendicularly and the light that passes through travels through an opening of an integrating sphere and is photoelectrically measured therein. The spectral sensitivity is adjusted to the CIE standard tristimulus spectral value function y under standard light C.

If the sample is placed directly in front of the opening of the integrating sphere, the total intensity of the light that has passed through is detected. In contrast, if the sample is disposed at a distance from the opening, essentially only the unscattered light transmitted in a straight line through the sample falls into the sphere. The difference in the two values divided by the total intensity thus yields the haze value as a percentage of the scattered light. This value can be read on the ordinate at the right, the scale being multiplied by a factor of 500. A haze value of 0.4% thus corresponds to the value 200 on the scale. The same scale is also used for the measured values of the unscaled Vickers hardness.

The haze values were determined after a standardized scrubbing test, in order to determine the scratch-resistant effect of the coatings. In this test, sandpaper with a granulation of 400 and under a defined pressure is rubbed several times over the sample to be tested and the sample is scratched in this way. The flat scrubbing head has a surface of 3*3 square centimeters and is loaded with a weight of 2 kg during its travel over the surface.

The measured transmission values are represented by triangles, the haze values by circles, and the Vickers hardness values by squares. Additionally, the calculated transmission of homogeneous silicon oxynitride layers of different oxygen content is plotted by diamonds.

The values shown at the very left in the diagram were measured on a layer deposited without introduction of oxygen. This layer accordingly involves a silicon nitride layer.

As expected, a clear decrease in Vickers hardness is shown with increasing oxygen content. With an oxygen fraction of 20% in the process gas, the Vickers hardness has already fallen from a value of 1850 for the pure silicon nitride layer to approximately 1400. Layers that are deposited with still higher oxygen percent accordingly have a Vickers hardness clearly less than 1400 on a borosilicate float glass substrate. A bar 11 corresponds to the Vickers hardness of an uncoated glass substrate. With an oxygen content of 75% in the process gas, the Vickers hardness of the coated substrate is not once 50% higher than the hardness of the uncoated glass plate. Nevertheless, the haze value is barely increased when compared with a pure, very hard silicon nitride layer and the transmission is very high.

The transmission increases starting from a value of approximately 82% in the wavelength region between 400 nanometers and 650 nanometers for the pure silicon nitride layer. Also, the haze value increases slightly.

The rapid increase in transmission is achieved by alternating layer systems with first and second layer parts, which are characterized by different oxygen contents and a slight variation in the refractive index with a value of Δn<0.25, indeed generally less than 0.15. With these transmissions, the oxygen content on the abscissa corresponds to the average oxygen content of the two layers.

The transmission lies above 90% in fact for coatings which were deposited with higher oxygen content in the process gas. Therefore, an oxygen-rich layer according to the invention barely influences the transmission, since the value for the transmission of an uncoated substrate, which is characterized by bar 12 is approximately 93%.

It is achieved via the alternating layer system that the transmission is clearly higher than the calculated values of the isotropic individual layers (the diamond points in FIG. 2) which result for a homogeneous silicon oxynitride layer with homogeneous composition.

It is also surprising that the haze value only increases moderately up to very high oxygen contents despite the continually decreasing Vickers hardness of the layer. Even in the case of a layer which was deposited with an oxygen content of 75% in the process gas, the haze value is only 0.8 percent after the scrubbing test. Here, the haze value of the uncoated substrate (the bar designated by the reference number 10) is indicated for comparison. The scrubbing-loaded, uncoated substrate accordingly has a haze value of approximately 3%. At 4%, the haze value of a layer deposited with 100% oxygen content again lies somewhat above a pure silicon oxide layer.

The samples were investigated with respect to their layer structure. For this purpose, the samples were analyzed by means of secondary-ion mass spectrometry. A cesium ion beam was used each time in order to sputter the layers.

Figure 3:
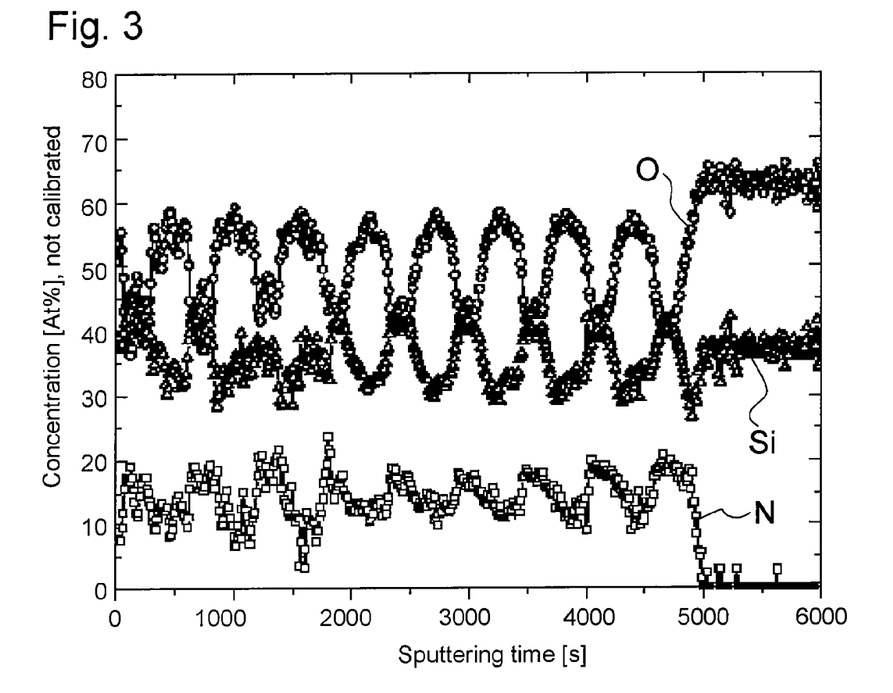
FIG. 3 shows a SIMS analysis of a silicon oxynitride layer, which was deposited by sputtering, with regulation of the oxygen content in the process gas.

The SIMS analysis shown in FIG. 3 was performed on a silicon oxynitride layer, which was deposited by sputtering with regulation of the oxygen content in the process gas according to the invention. The oxygen content in the process gas here nominally amounted to approximately 43.9%.

Based on the SIMS analysis, it can be observed that the coating has a structure of layer parts. In addition, it can be observed that the nitrogen and oxygen concentrations continually change in opposite manner.

Intervals with little nitrogen content and intervals with high nitrogen content are observed to alternate. The oxygen concentration runs counter to this.

The layer thickness amounts to approximately 1600 nm.

The following average composition of the coating can be derived from the SIMS analysis: 49 at. % oxygen, 15 at. % nitrogen, 36 at. % silicon.

The period of the oscillations of the oxygen and nitrogen concentrations amounts to 571 seconds referred to the sputtering time. This corresponds to a thickness of approximately 182 nanometers. The nitrogen concentration varies approximately in a sawtooth pattern, the concentration in the layer parts decreasing in each case proceeding from the surface of the sample to the depths of the layer. The nitrogen concentration decreases starting from approximately 20 at. % decreasing to 10 at. % only to then increase again. The variation in oxygen concentration shows rather a wave pattern and varies between approximately 42 at. % and 57 at. %.

This coating can thus be characterized as a layer having multiple layer parts with gradual change in concentration or as a gradient layer having multiple layer parts.

In summary, it can be derived from the SIMS measurement that the layers which bring about a higher transmission in comparison to uniform silicon oxynitride layers have nitrogen and oxygen concentrations that vary in opposing manner.

In general, it should be favorable if the layer parts with lower refractive index have an oxygen content that is higher by a factor between 1.1 and 2 than in the layer parts with higher refractive index.

The variations of the composition were produced by the pendulum movement of the substrate in front of the target. The process-gas composition is influenced by the varying position of the substrate in front of the target. Of course, in general, an appropriate variation in the composition in the direction perpendicular to the coating can be guided in a targeted manner, but also in another way, e.g., by periodically varying the oxygen content during the deposition of the layer.

Figure 4:
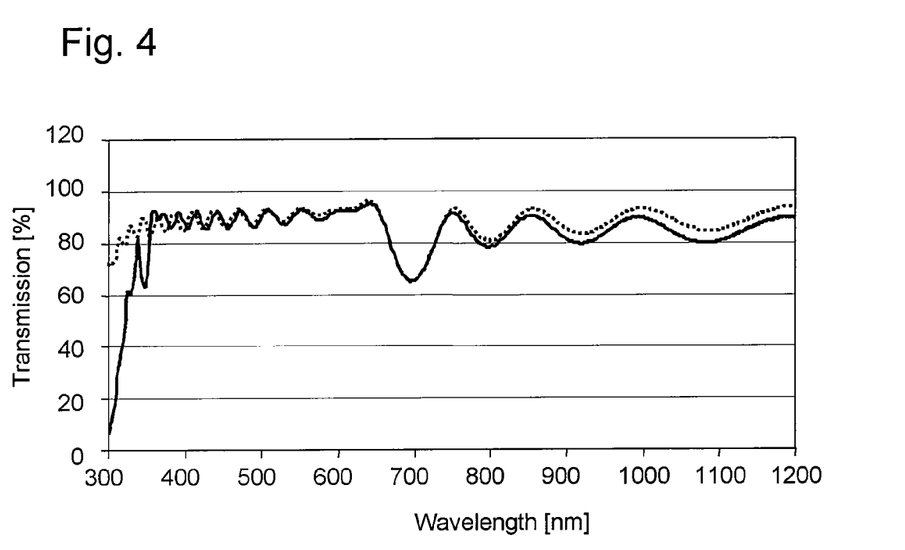
FIG. 4 shows a comparison between the transmission of a substrate having a silicon oxynitride layer deposited with regulation of the oxygen content and the calculated transmission of a model.

In order to further characterize the optical properties of the layers, the transmission of the samples was measured as a function of wavelength and compared with models. For this purpose, FIG. 4 shows a comparison between the transmission of a sample which was used for the SIMS measurement shown in FIG. 3 and the calculated transmission of a model.

Figure 5:
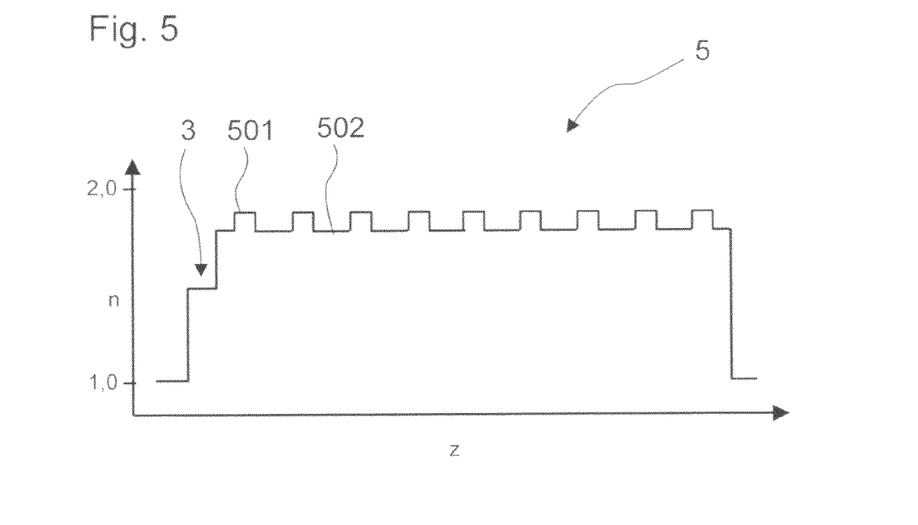
FIG. 5 shows the curve for the refractive index of a coating for the model which is the basis for the simulation of FIG. 4.

The model which is used and which functions best for adapting to the measured values is shown in FIG. 5. The curve represented by the dotted line in FIG. 4 show the simulated transmission values. The solid curve represents the measured transmission.

The coordinate z in FIG. 5 designates the relative position along a direction perpendicular to the surface of the coating.

Coating 5 on substrate 3 is associated with a refractive index of approximately 1.5, and this coating in turn is divided into oxygen-poor layers 501 with higher refractive index and oxygen-rich layers 502 with lower refractive index. The air surrounding the substrate and the coating in each case is associated with a refractive index of one.

In the model, the higher refracting layers 501 of 62 nanometers are thinner than the lower-refracting layers 502, which have a layer thickness of 125 nanometers in the model. The corresponding refractive index curve is shown in FIG. 5. Based on the very similar transmission curves in FIG. 4, it can be seen that the model very well approximates the actual coating with regard to optics.

The compositions determined from the SIMS measurements of FIG. 3 for the layers 501, 502 were the basis for the model each time.

The following layer sequence is the basis for the model:

The refractive index of the low-refracting first layers 502 is 1.775 at 550 nanometers wavelength. The high-refracting second layers 501 have a refractive index of 1.86 at 550 nanometers wavelength. The difference in the refractive index accordingly only amounts to 0.085. Generally, it is favorable for the scratch-resistant properties if the difference in the refractive index amounts to no more than 0.2 and the ratio of the percentages of oxygen and nitrogen in the total composition vary no more than by a factor of 2 between the first layer parts 502 and the second layer parts 501.

First, a 62-nanometer thick first layer part 502 is directly next to substrate 3. Following this are eight pairs of high-refracting and low-refracting layer parts, in which each of the high-refracting layer parts 501 has a thickness of 62 nanometers and each of the low-refracting layer parts 502 has a thickness of 125 nanometers. Following this are one 62.2-nanometer thick second layer part 501 and finally a 62.5-nanometer thick first layer part 502.

The very good properties of a layer with respect to the obtained transmission, as shown in FIG. 3, can thus also be realized by means of a silicon oxynitride layer that has several first and second layer parts following one another, in which the first layer parts have a higher oxygen content than the second layer parts and in which the oxygen and nitrogen concentrations alternate abruptly, thus showing sharp interfaces.

Another possibility also consists of an alternating deposition of an alternating layer system of silicon oxynitride layers and silicon nitride layers. Since the two materials clearly differ in their refractive index, an effective interference layer system can be built up. This can then be constructed as an anti-reflex layer system. A variant of the example shown in FIG. 1 is presented in FIG. 6.

Figure 6:
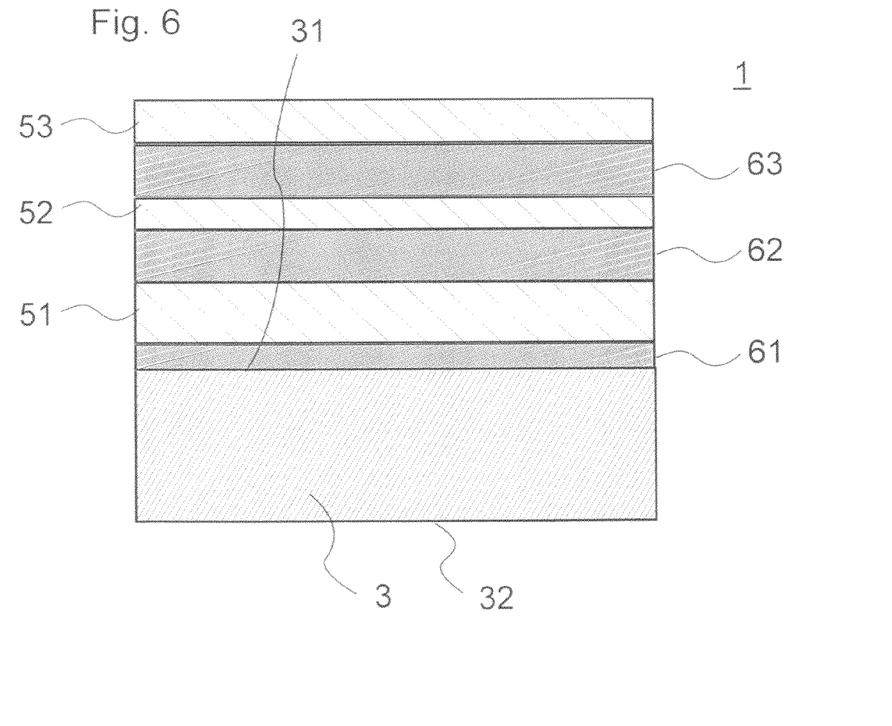
FIG. 6 shows a variant of the glass article shown in FIG. 1 having a scratch-resistant layer in the form of a silicon nitride/silicon oxynitride alternating layer system.

In all, the layer system comprises six layer parts, in which the layer parts 61, 62, 63 are silicon nitride layer parts and layer parts 51, 52, 53 are silicon oxynitride layer parts. The layer system begins on the substrate side with layer part 61, thus a silicon nitride layer part.

The layer thicknesses of an example of embodiment with good anti-reflecting effect are indicated in the following table:

| Layer, reference numbers in FIG. 6 | Thickness [nm] |
|---|---|
| Substrate, 3 | as desired |
| Silicon nitride, 61 | 115 |
| Silicon oxynitride, 51 | 275 |
| Silicon nitride, 62 | 234 |
| Silicon oxynitride, 52 | 142 |
| Silicon nitride, 63 | 233 |
| Silicon oxynitride, 53 | 189 |
| Air | |

The layer system has a total thickness of 1188 nm. An increase in the transmission is produced here by multiple reflection and interference effects.

Figure 7:
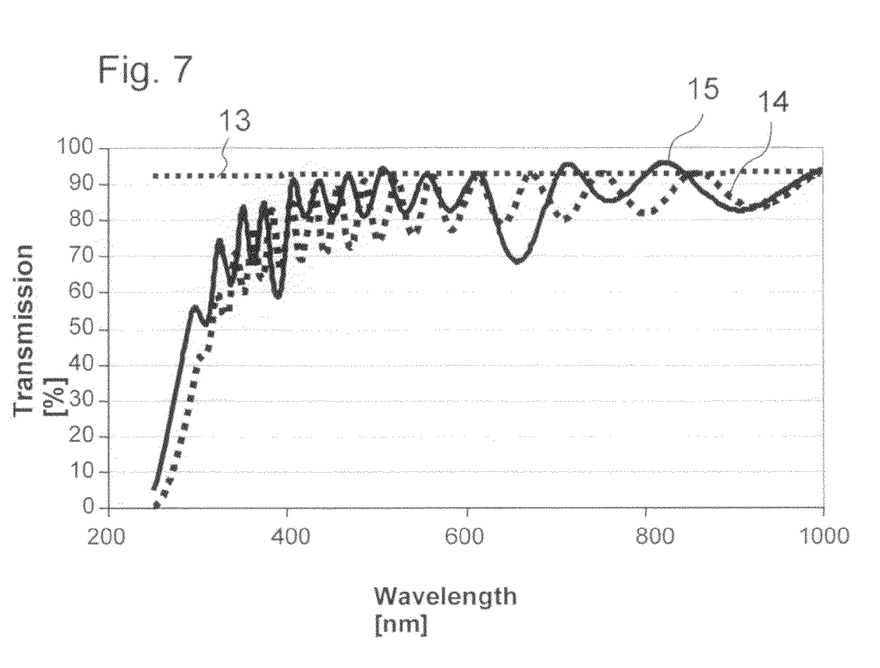
FIG. 7 shows calculated transmission curves for the silicon nitride/silicon oxynitride alternating layer system shown in FIG. 6, for a pure silicon nitride layer of the same thickness, and for an uncoated substrate.

For this purpose, FIG. 7 shows the calculated curve 15 of the transmission of the layer system as a function of the wavelength. For comparison, curve 14 for the transmission of a pure silicon nitride layer of the same thickness and curve 13 for the transmission of an uncoated substrate 3 are shown. With the example of embodiment shown in FIG. 6 and the layer thicknesses used in the table above, the transmission (average in the visible spectral region between 400 nm and 650 nm) for a pure silicon nitride layer can be increased from 82.2% to approximately 86.1%.

Basically, other layer thicknesses and a plurality of designs, e.g., with another number of layers are also possible. For practical reasons, of course, it is favorable, if the layer system has fewer than 20 layers (preferably fewer than 10 layers) and the individual layer thicknesses lie in the range between 5 nm and 1000 nm (preferably between 100 nm and 300 nm).

A smaller number of layers offers economical advantages in production, in particular during sputtering, in which the substrate is moved back and forth in pendulum manner in front of the target without anything further, but moving the target back and forth between two targets is not accompanied by, or is substantially not accompanied by, a prolonging of the process.

It is obvious to the person skilled in the art that the invention is not limited to the embodiment examples described above, but rather can be varied within the scope of the subject of the following claims. In this way also, the features of the embodiment examples may be combined with one another. Thus, a silicon oxynitride layer with varying oxygen content, as was described, e.g., on the basis of FIGS. 3, 6 and 8, can also be combined with silicon nitride layers, as is shown, e.g., in FIG. 6.

The invention claimed is:

1. A glass article with a scratch-resistant coating, comprising:
   a glass or glass-ceramic substrate,
   a silicon oxynitride layer deposited on the substrate as a scratch-resistant layer, wherein the silicon oxynitride layer has a ratio of atomic percentages of oxygen to nitrogen of more than 1 as measured with secondary-ion mass spectrometry and etching of the layer by means of a cesium ion beam, and
   wherein the silicon oxynitride layer has a layer thickness of at least 500 nanometers, and
   wherein the silicon oxynitride layer comprises several first layer parts and several second layer parts following one another, the first layer parts having a higher oxygen content than the second layer parts.

2. The glass article according to claim 1, wherein the ratio of atomic percentages of oxygen to nitrogen in the silicon oxynitride layer amounts to 20 at most, as measured with secondary-ion mass spectrometry and etching of the layer by means of a cesium ion beam.

3. The glass article according to claim 1, wherein the silicon oxynitride layer is directly deposited onto a surface of the glass or glass-ceramic substrate.

4. The glass article according to claim 1, wherein the silicon oxynitride layer has a Vickers hardness of less than 1400.

5. The glass article according to claim 1, wherein the silicon oxynitride layer has a refractive index that is at most 1.9 and at least 1.6.

6. The glass article according to claim 1, wherein the substrate is transparent.

7. The glass article according to claim 6, wherein the glass article in the form of a coated plate that has an average transmission of at least 86% in a wavelength region between 400 nanometers and 650 nanometers.

8. The glass article according to claim 1, wherein the silicon oxynitride layer has a morphology without structure.

9. The glass article according to claim 1, wherein the first layer parts have an oxygen content which is higher by a factor between 1.1 and 2 than the second layer parts.

10. The glass article according to claim 1, wherein the first and second layer parts each have a refractive index that differs by at most 0.25.

11. The glass article according to claim 1, wherein the silicon oxynitride layer is formed as a gradient layer having multiple layer parts.

12. The glass article according to claim 1, wherein the glass article is used as a viewing window for a motor vehicle, as a viewing window for a checkout scanner, or as a glass-ceramic cooktop.

13. The glass article according to claim 1, wherein the silicon oxynitride layer has a layer thickness of between 1 and 2 μm.

14. The glass article according to claim 1, wherein the silicon oxynitride layer is in direct contact with the glass or glass-ceramic substrate and wherein the silicon oxynitride layer has a ratio of atomic percentages of oxygen to nitrogen of at least 2 and less than 20 as measured with secondary-ion mass spectrometry and etching of the layer by a cesium ion beam.

15. The glass article according to claim 14, wherein the silicon oxynitride layer has a thickness with a homogeneity of better than 95%.

16. The glass article according to claim 14, wherein the silicon oxynitride layer has a refractive index of between 1.9 and 1.6 and the substrate has a refractive index of less than 1.6.

17. The glass article according to claim 14, wherein the silicon oxynitride layer has a layer thickness of between 1 and 2 μm.

18. A glass article with a scratch-resistant coating, comprising:
   a glass or glass-ceramic substrate,
   a silicon oxynitride layer deposited on the substrate as a scratch-resistant layer, wherein the silicon oxynitride layer has a ratio of atomic percentages of oxygen to nitrogen of more than 1 as measured with secondary-ion mass spectrometry and etching of the layer by means of a cesium ion beam,
   wherein the silicon oxynitride layer has a layer thickness of at least 500 nanometers, and
   wherein the substrate comprises a volume-colored glass ceramic.

19. A glass article with a scratch-resistant coating, comprising:
   a glass or glass-ceramic substrate,
   a silicon oxynitride layer deposited on the substrate as a scratch-resistant layer, wherein the silicon oxynitride layer has a ratio of atomic percentages of oxygen to nitrogen of more than 1 as measured with secondary-ion mass spectrometry and etching of the layer by means of a cesium ion beam, and
   wherein the silicon oxynitride layer has a layer thickness of at least 500 nanometers,
   wherein the scratch-resistant layer comprises a scratch-resistant coating having multiple layer parts with at least one layer comprising the silicon oxynitride layer, and
   wherein the multiple layer parts of the scratch-resistant coating comprise an alternating layer system of at least one layer comprising the silicon oxynitride layer and at least one layer comprising a silicon nitride layer.

* * * * *